(12) United States Patent
Miller et al.

(10) Patent No.: US 6,791,545 B2
(45) Date of Patent: Sep. 14, 2004

(54) MEASUREMENT ICONS FOR DIGITAL OSCILLOSCOPES

(75) Inventors: Martin Thomas Miller, Avusy (CH); Anthony Cake, Meyrin (CH)

(73) Assignee: LeCroy Corporation, Chestnut Ridge, NY (US)

(*) Notice: Subject to any disclaimer, the term of this patent is extended or adjusted under 35 U.S.C. 154(b) by 79 days.

(21) Appl. No.: 10/013,563

(22) Filed: Dec. 11, 2001

(65) Prior Publication Data

US 2003/0107573 A1 Jun. 12, 2003

(51) Int. Cl.[7] .................................................. G06T 5/22
(52) U.S. Cl. ........................ 345/440; 345/441; 345/771
(58) Field of Search ................................ 345/440, 441, 345/771; 702/68

(56) References Cited

U.S. PATENT DOCUMENTS

| | | | | | |
|---|---|---|---|---|---|
| 5,226,118 | A | * | 7/1993 | Baker et al. | ................ 345/440 |
| 5,953,009 | A | * | 9/1999 | Alexander | ................ 345/771 |
| 6,320,577 | B1 | * | 11/2001 | Alexander | ................ 345/440.1 |
| 6,326,987 | B2 | * | 12/2001 | Alexander | ................ 345/771 |
| 6,507,796 | B2 | * | 1/2003 | Alexander | ................ 702/70 |
| 6,522,345 | B1 | * | 2/2003 | Alexander | ................ 345/771 |
| 2001/0000964 | A1 | * | 5/2001 | Alexander | ................ 345/440 |
| 2002/0030683 | A1 | * | 3/2002 | Alexander | ................ 345/440.1 |
| 2002/0128786 | A1 | * | 9/2002 | Alexander | ................ 702/66 |

* cited by examiner

Primary Examiner—Michael Razavi
Assistant Examiner—Faranak Foulad
(74) Attorney, Agent, or Firm—Frommer Lawrence & Haug LLP; William S. Frommer

(57) ABSTRACT

A method and apparatus for displaying measurements of a waveform as icons on an oscilloscope. The apparatus acquires and processes a waveform thereby obtaining a number of measurements. Typically, the measurements are histograms, tracking measurements, and/or trending measurements. The oscilloscope displays both the waveform and a number of icons that respectively show the measurements. Each icon is a miniature rendering of the corresponding measurement and may be static, periodically updated, or a real-time preview of the actual measurement data which is calculated in the background by the oscilloscope processor. A user can select one of the icons to display the corresponding measurement at full size on the display.

18 Claims, 5 Drawing Sheets

MEASUREMENT ICONS FOR DIGITAL OSCILLOSCOPES

The following applications and patents are hereby incorporated by reference: U.S. Pat. No. 6,151,010 issued Nov. 21, 2000; U.S. Pat. No. 6,195,617 issued Feb. 27, 2001; U.S. Provisional Application Serial No. 60/294,921 filed May 31, 2001; and U.S. application Ser. No. 09/988,420 filed Nov. 16, 2001.

BACKGROUND OF THE INVENTION

The present invention relates generally to a method and apparatus for displaying measurement icons for various waveform parameters on an oscilloscope.

Traditionally, digital storage oscilloscopes (DSOs) capture an electrical signal (waveform) and allow the user to view a trace of the captured signal in a time (x-axis) versus amplitude (y-axis) display. In addition to displaying the signal's trace, DSOs can perform mathematical processing on the captured waveform. This processing can be used to transform the entire waveform or to determine certain properties (features, parameters, measurements) of the captured signal. These properties are traditionally displayed as individual values associated with a particular signal trace on the DSO's screen. Typically, the processing is controlled and/or pre-selected using various display menus.

When analyzing a single feature of a particular captured signal (e.g. the rising edge of a signal), the ability to display processed values is a valuable tool. However, to analyze a large number of features and/or waveforms, this simple display approach often results in too much information to be effectively displayed. Furthermore, DSOs are now capable of performing numerous complex processing operations. Because of this there is an information display overload problem and many of these operations are often simply not presented as options to a user.

SUMMARY OF THE INVENTION

Therefore, a need exists for a capability to perform multiple complex processing operations on a waveform while effectively displaying the results to the user. Preferably, a solution to this problem should be cost effective and readily implementable.

The recent incorporation of graphical user interfaces into digital oscilloscopes along with advancements in operating systems to support multi-tasked background processing now allow for the practical processing and display of multiple parametric measurements on acquired waveforms.

It is therefore an object of the present invention to provide a method and apparatus for displaying measurement icons for various waveform parameters on an oscilloscope.

The preferred embodiment of the invention provides an oscilloscope apparatus displaying measurement icons for various waveform parameters on an oscilloscope. The oscilloscope apparatus has an acquisition unit for acquiring a waveform. A processor is used to process the waveform thereby obtaining a plurality of measurements. A renderer displays the waveform and a number of icons that respectively show the plurality of measurements. A user interface on the apparatus may be used to select one of the icons. The renderer then displays the measurement corresponding to the selected icon on the display.

Another aspect of the invention is that the plurality of measurements may include histograms, tracking measurements, and/or trending measurements from the processed waveform. Each of the icons is a miniature rendering that may provide a live preview of the corresponding measurement. The measurements may be predetermined by the operator of the apparatus and/or selected from stored sets of measurements. In addition, the icons may be displayed in a dashboard section of the display.

The second embodiment provides a method of displaying measurement icons for various waveform parameters on an oscilloscope apparatus. The method comprises the steps of: acquiring a waveform, processing the waveform to obtain a plurality of measurements, displaying the waveform and a plurality of icons respectively showing the measurements on a display, selecting one of the plurality of icons, and displaying the measurement corresponding to the selected icon on the display.

In the second embodiment, the plurality of measurements may include histograms, tracking measurements, and/or trending measurements from the processed waveform. Each of the icons is a miniature rendering that may provide a live preview of the corresponding measurement. The measurements may be predetermined by the operator of the apparatus and/or selected from stored sets of measurements. In addition, the icons may be displayed in a dashboard section of the display.

Other objects and advantages of the invention will in part be obvious and will in part be apparent from the specification and the drawings.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The preferred embodiments of the apparatus and method according to the present invention will be described with reference to the accompanying drawings.

The invention concerns a digital oscilloscope that has been augmented with capabilities to derive and display measurements of a waveform as icons. In the preferred embodiment, the oscilloscope is a digital storage-type oscilloscope that acquires and processes a waveform thereby obtaining a number of measurements. These measurements are typically histograms, tracking measurements, and/or trending measurements. The oscilloscope displays both the waveform and a number of icons that respectively show measurements at various points of processing. These measurements provide a powerful tool in the analysis of waveforms acquired by DSOs. Although similar measurements may be made by other DSOs through complex processing and display procedures, for various reasons, many users never manage to find the power of these tools. The invention provides ready access to these measurements directly on the display of the oscilloscope in a clear and precise manner, and defines a straightforward manner in which to implement these measurements.

Figure 1:
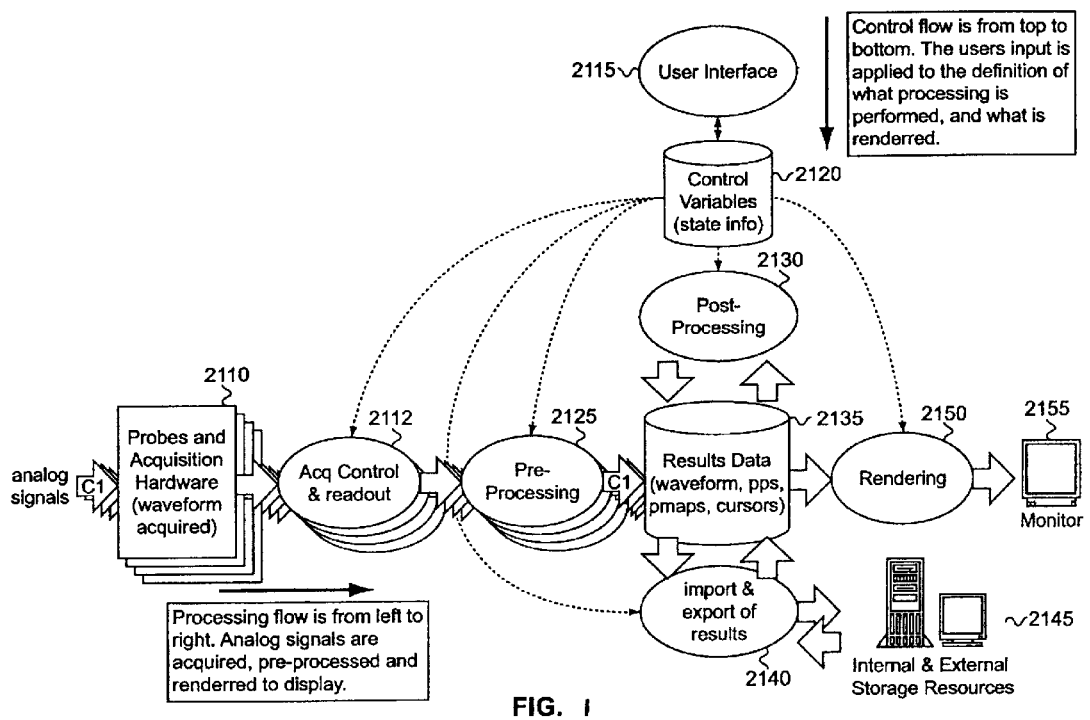
FIG. 1 is a system diagram showing the functional connections in an oscilloscope constructed in accordance with the invention.

FIG. 1 depicts a conceptualized view of the operation of an oscilloscope in which the invention may be implemented. The flow of data is shown from left to right and control sequences provided by a user, either automated or manual, are shown from top down. As is shown in FIG. 1, a plurality of analog acquisition signals $C_1$ may be acquired by the oscilloscope of the invention. These acquisition signals are acquired in accordance with various provided probes and other acquisition hardware 2110 that are in turn controlled by an acquisition control module 2112. Various acquisition control processes are applied to the acquired waveforms in accordance with various control variables 2120 provided by the user via a user interface 2115. Various results data are then provided to, and thereafter output from a preprocessing system 2125, and are in turn acted upon in various post processing functions 2130 employing user defined control variables 2120, resulting in processed data (Results data) 2135. The post-processed data is then exported and/or imported at 2140 as necessary for further processing by the system 2145 in accordance with control variables 2120. After processing has been completed, the various processed data is converted for display at 2150 on a display device 2155.

Figure 2:
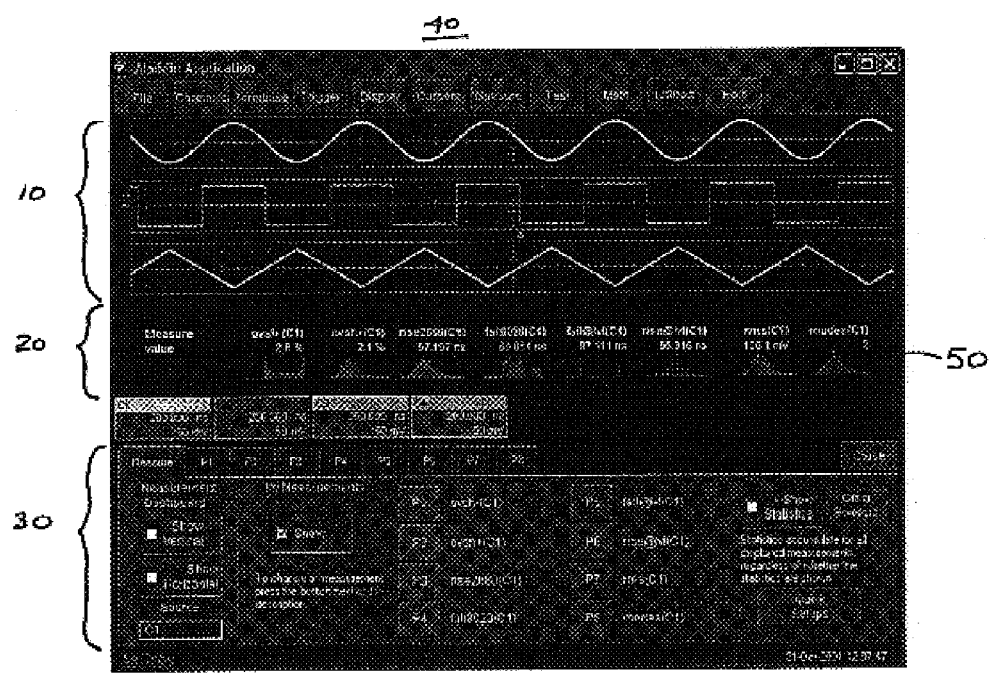
FIG. 2 is an image of an oscilloscope display having a measurement dashboard containing icons in accordance with the invention.

FIG. 2 shows an exemplary display screen 40 from an oscilloscope implementing the invention, such as the one described in FIG. 1. Waveform traces are shown in the top third of the display 10. A dashboard 20 of measured values is shown in the center of the display. An icon 50 is displayed for each measurement in the dashboard. Each icon is a miniature rendering of the corresponding measurement and may be static, periodically updated, or a real-time (live) preview of the actual measurement data.

In real-time mode, the icon is a "live-preview" of the measurement results (statistics on the parameter) which are being processed in the background by the oscilloscope. In this sense, the icon is not animated by a fixed sequence of images, but rather by real statistical information. Measurement results are collected and stored in a results table regardless of whether the operator asks to view the statistics. Each measurement, such as a histogram, is stored as a "cell" in the results table.

The rendering (display) of an icon is determined by the size of the cell in the results table. Of course, certain measurements (e.g. histograms) have an arbitrary scale and number of bins. For example, a typical histogram may have 60 bins with the scale being automatically determined at several arbitrary populations (5, 50 and 500 measurements).

Again referring to FIG. 2, a measurement window 30 for configuring the measurements to be performed by the oscilloscope is shown in the bottom third of the display. For example, radio buttons in the measurement window can be used to set the statistics mode, the measurements to be displayed, and whether the icons are a live-preview of the measurement or simply static renderings. In addition, various other windows (P1–P8) can be accessed from the measurement window 30 to configure and define the measurements. Furthermore, sets of measurements may be predetermined and stored by the user.

Figure 3:
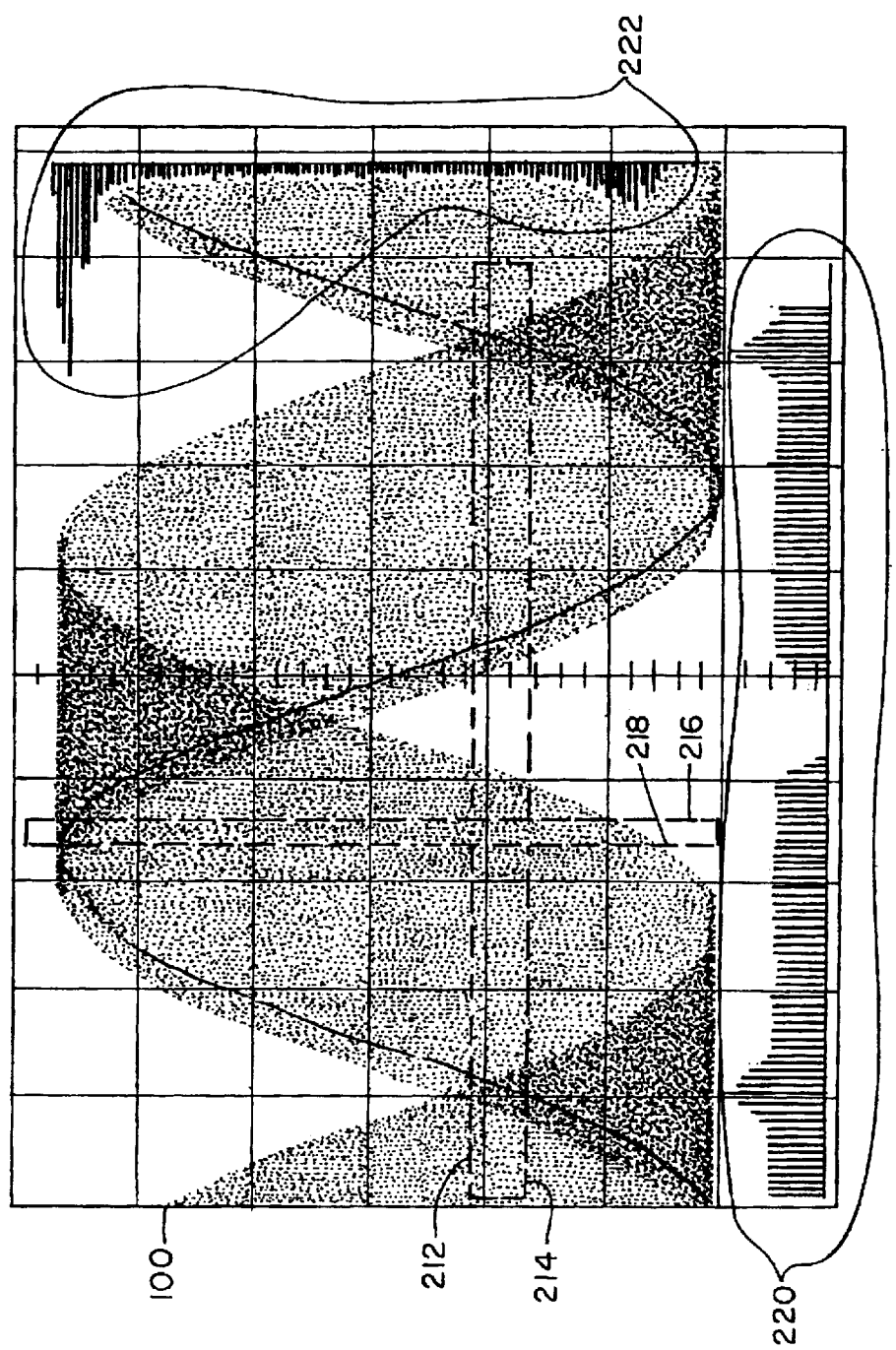
FIG. 3 is an image of an oscilloscope display showing a function trace with histograms superimposed along each axis.

A user can select one of the icons displayed in the dashboard simply by clicking on it with a cursor to display the corresponding measurement at full size on the display. For example, if a histogram icon is selected a full-size histogram may be displayed in place of one or more of the traces. Alternately, the histogram may be superimposed along either (or both) axis of the trace, as shown in FIG. 3. Further, a user may simply place a cursor over the icon to reveal a popup menu which permits the operator to change/configure the icon and/or the measurement (e.g. changing the measurement icon to a log scale).

FIG. 3 shows an example of an oscilloscope display 100 according to the present invention wherein an icon for a histogram measurement has been selected, such that the histogram is now superimposed on the x and y axes of the waveform trace. The histogram 220 for the sampling times delineated by the box indicated at 212 and 214 are displayed across the bottom of the screen, and the amplitude histogram 222 for samples delineated by the box 216, 218 is displayed vertically on the right side of the screen. As shown, the histograms become larger when there are greater populations for the signal.

Figure 4:
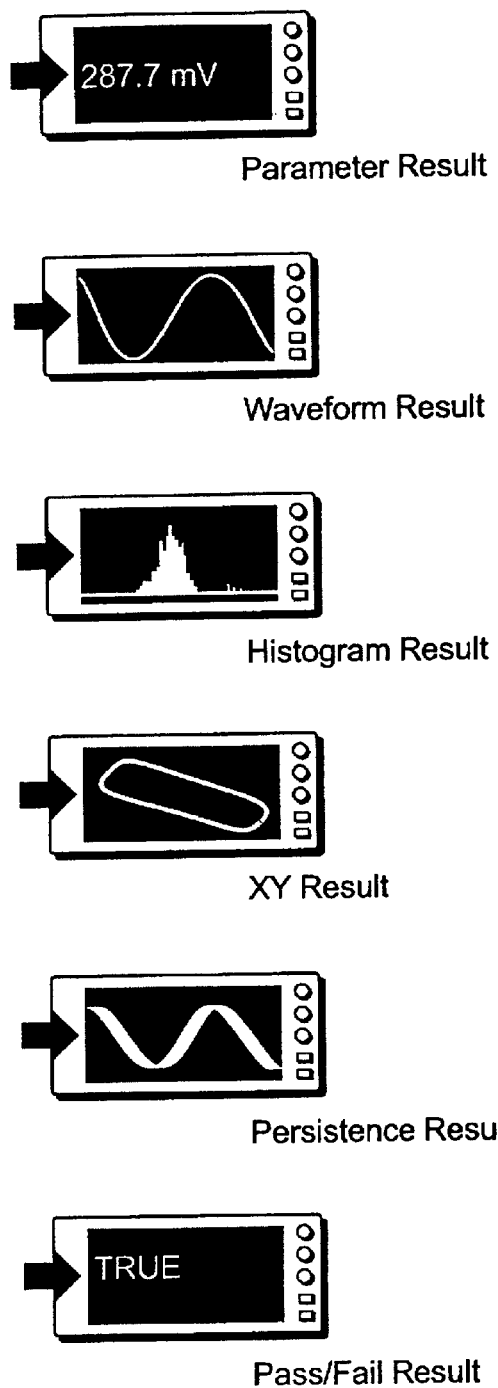
FIG. 4 depicts various types of measurements that may be displayed as icons in accordance with the invention.

As mentioned previously, icons are typically displayed for histograms, tracking measurements, and/or trending measurements. However, an icon can be displayed for any measurement possible by an oscilloscope including: risetime, fall-time, amplitude, period, frequency, width, top, base, peak to peak, maximum, minimum, duty factor, time over threshold, time under threshold, delta-period (difference between adjacent cycle periods), delta-time at level, data (waveform's vertical values), etc. FIG. 4 shows a representative set of the types of measurements which can be displayed.

Histograms are used to enhance the operator's understanding of the distribution of measured parameters, visually and graphically. A histogram can identify the type of statistical distribution in the waveform, thereby helping to establish whether a signal's behavior is as expected. Distribution tails or extreme values related to noise, or other infrequent, non-repetitive sources, can also be observed in a histogram. Also revealed, are frequencies or amplitudes that help in identifying and quantifying jitter and noise so that it can be removed by other processing operations.

Histograms graph the statistical distribution of a parameter's set of values. A histogram bar chart is divided into intervals, or bins. The height of each bar in the chart is proportional to the number of data points contained in each of its bins. The more points there are in a bin (and in the area of the waveform they represent), the higher the bar.

Figure 5:
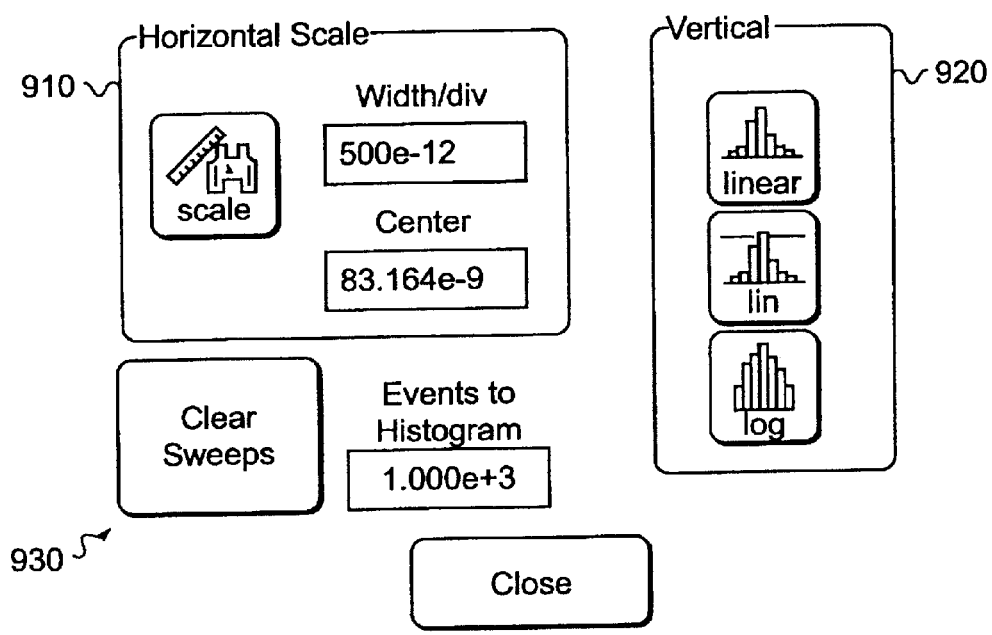
FIG. 5 depicts parameters that may be set for a histogram.

FIG. 5 shows examples of some of the parameters that may be set for a histogram. As shown in FIG. 5, the user may control the horizontal scale 910, vertical scale 920 and various other defined features 930 of the histogram.

Tracking and trending measurements are a way to visualize the progress and evolution of the measurements. Tracking measurements are derived parameters calculated from a primary measurement and simultaneously displayed on the same time axis. This allows the operator to correlate features found in the derived parameters directly with the primary measurements of the signal. Trending measurements visualize the evolution of a parameter over time in the form of a line graph. The graph's vertical axis is the value of the parameter; its horizontal axis is the order in which the values were acquired. Alternately, the horizontal axis can be in units of time.

While a preferred embodiment of the present invention has been described using specific terms, such description is for illustrative purposes only, and it is to be understood that changes and variations may be made without departing from the spirit or scope of the following claims.

What is claimed is:

1. An oscilloscope apparatus, comprising:

an acquisition unit for acquiring a waveform;

a processor for processing said waveform to obtain a plurality of measurements, each comprising processed data of the acquired waveform;

a renderer for displaying said waveform and a plurality of icons respectively showing the plurality of measurements on a display, each of said plurality of icons being a miniature rendering which provides a live preview of the corresponding measurement and being at least periodically updated based upon the processed data from the acquired waveform; and a user interface for selecting one of said plurality of icons, said renderer displaying the measurement corresponding to the selected icon on the display.

2. The oscilloscope apparatus according to claim 1, wherein said plurality of measurements includes at least a histogram of the processed waveform.

3. The oscilloscope apparatus according to claim 1, wherein said plurality of measurements includes at least a tracking measurement of the processed waveform.

4. The oscilloscope apparatus according to claim 1, wherein said plurality of measurements includes at least a trending measurement of the processed waveform.

5. The oscilloscope apparatus according to claim 1, wherein said plurality of measurements is predetermined by a user.

6. The oscilloscope apparatus according to claim 1, wherein said plurality of measurements is selected from stored sets of measurements predetermined by a user.

7. The oscilloscope apparatus according to claim 1, wherein said plurality of icons is displayed in a dashboard on the display.

8. A method of displaying measurements on an oscilloscope apparatus, comprising the steps of:

a) acquiring a waveform;

b) processing said waveform to obtain a plurality of measurements, each comprising processed data of the acquired waveform;

c) displaying said waveform and a plurality of icons respectively showing the measurements on a display, each of said plurality of icons being a miniature rendering which provides a live preview of the corresponding measurement and being at least periodically updated based upon the processed data from the acquired waveform;

d) selecting one of said plurality of icons; and e) displaying the measurement corresponding to the selected icon on the display.

9. The method according to claim 8, wherein said plurality of measurements includes at least a histogram of the processed waveform.

10. The method according to claim 8, wherein said plurality of measurements includes at least a tracking measurement of the processed waveform.

11. The method according to claim 8, wherein said plurality of measurements includes at least a trending measurement of the processed waveform.

12. The method according to claim 8, wherein said plurality of measurements is predetermined by a user.

13. The method according to claim 8, wherein said plurality of measurements is selected from stored sets of measurements predetermined by a user.

14. The method according to claim 8, wherein said plurality of icons is displayed in a dashboard on the display.

15. An oscilloscope apparatus, comprising:

an acquisition means for acquiring a waveform;

processing means for processing said waveform to obtain a plurality of measurements, each comprising processed data of the acquired waveform;

rendering means for displaying said waveform and a plurality of icons respectively showing the plurality of measurements on a display, each of said plurality of icons being a miniature rendering which provides a live preview of the corresponding measurement and being at least periodically updated based upon the processed data from the acquired waveform; and selecting means for selecting one of said plurality of icons; said rendering means displaying the measurement corresponding to the selected icon on the display.

16. The oscilloscope apparatus according to claim 15, wherein said plurality of measurements is predetermined by a user.

17. The oscilloscope apparatus according to claim 15, wherein said plurality of measurements is selected from stored sets of measurements predetermined by a user.

18. The oscilloscope apparatus according to claim 15, wherein said plurality of icons is displayed in a dashboard on the display.

* * * * *